(12) United States Patent
Schueller et al.

(10) Patent No.: US 7,476,523 B2
(45) Date of Patent: Jan. 13, 2009

(54) METHOD OF PATTERNING A SURFACE USING A DEFORMABLE STAMP

(75) Inventors: Olivier Schueller, Somerville, MA (US); Enoch Kim, Boston, MA (US); George Whitesides, Newton, MA (US)

(73) Assignee: Surface Logix, Inc., Brighton, MA (US)

( * ) Notice: Subject to any disclaimer, the term of this patent is extended or adjusted under 35 U.S.C. 154(b) by 0 days.

(21) Appl. No.: 09/929,736

(22) Filed: Aug. 14, 2001

(65) Prior Publication Data

US 2002/0050220 A1    May 2, 2002

Related U.S. Application Data

(60) Provisional application No. 60/225,175, filed on Aug. 14, 2000.

(51) Int. Cl.
| | |
|---|---|
| C12N 11/00 | (2006.01) |
| C12N 11/14 | (2006.01) |
| C12N 11/02 | (2006.01) |
| C12N 11/08 | (2006.01) |
| B41F 31/00 | (2006.01) |
| B41K 1/38 | (2006.01) |
| C07K 17/00 | (2006.01) |
| C07K 17/02 | (2006.01) |
| C07K 17/08 | (2006.01) |
| C07K 17/14 | (2006.01) |

(52) U.S. Cl. ............... 435/174; 101/327; 435/176; 435/177; 435/180; 530/810; 530/811; 530/812; 530/815

(58) Field of Classification Search .......... 435/174, 435/177, 180
See application file for complete search history.

(56) References Cited

U.S. PATENT DOCUMENTS

| 2,957,410 | A |   | 10/1960 | Traphagen ............ 101/110 |
| 3,745,970 | A | * | 7/1973  | Scantlebury ........... 118/50 |
| 4,260,725 | A |   | 4/1981  | Keogh et al. .......... 526/279 |
| 4,686,267 | A |   | 8/1987  | Ellis et al. ............ 526/245 |
| 4,690,993 | A |   | 9/1987  | Falcetta et al. ........ 526/242 |
| 4,711,943 | A |   | 12/1987 | Harvey ................ 526/279 |
| 4,740,533 | A |   | 4/1988  | Su et al. .............. 523/106 |
| 5,079,319 | A |   | 1/1992  | Mueller ............ 526/238.23 |
| 5,143,854 | A |   | 9/1992  | Pirrung et al. ......... 436/518 |
| 5,250,583 | A |   | 10/1993 | Kawaguchi et al. ...... 523/107 |
| 5,331,067 | A |   | 7/1994  | Seidner et al. ......... 525/479 |
| 5,387,663 | A |   | 2/1995  | McGee et al. .......... 526/279 |
| 5,435,245 | A |   | 7/1995  | Salisbury et al. ....... 101/328 |
| 5,512,131 | A |   | 4/1996  | Kumar et al. ......... 156/655.1 |
| 5,669,303 | A |   | 9/1997  | Maracas et al. ........ 101/327 |
| 5,725,788 | A |   | 3/1998  | Maracas et al. ........ 216/41 |
| 5,727,977 | A |   | 3/1998  | Maracas et al. ........ 445/24 |
| 5,776,748 | A |   | 7/1998  | Singhvi et al. ........ 435/180 |
| 5,817,242 | A |   | 10/1998 | Biebuyck et al. ....... 216/41 |
| 5,900,160 | A |   | 5/1999  | Whitesides et al. ..... 216/41 |
| 5,925,259 | A |   | 7/1999  | Biebuyck et al. ....... 216/2 |
| 5,937,758 | A |   | 8/1999  | Maracas et al. ........ 101/327 |
| 5,947,027 | A |   | 9/1999  | Burgin et al. ......... 101/474 |
| 5,948,621 | A |   | 9/1999  | Turner et al. ......... 435/6 |
| 5,951,881 | A |   | 9/1999  | Rogers et al. ......... 216/41 |
| 5,965,237 | A |   | 10/1999 | Bruin et al. .......... 428/156 |
| 5,976,826 | A |   | 11/1999 | Singhvi et al. ........ 435/29 |
| 6,004,444 | A |   | 12/1999 | Aksay et al. .......... 204/515 |
| 6,013,446 | A |   | 1/2000  | Maracas et al. ........ 435/6 |
| 6,020,047 | A |   | 2/2000  | Everhart ............. 428/209 |
| 6,027,595 | A |   | 2/2000  | Suleski ............. 156/230 |
| 6,033,202 | A |   | 3/2000  | Bao et al. ............ 425/120 |
| 6,039,897 | A |   | 3/2000  | Lochhead et al. ....... 264/1.24 |
| 6,060,121 | A |   | 5/2000  | Hidber et al. ......... 427/261 |
| 6,180,239 | B1 | * | 1/2001  | Whitesides et al. ..... 428/411.1 |
| 6,645,432 | B1 | * | 11/2003 | Anderson et al. ....... 422/100 |

FOREIGN PATENT DOCUMENTS

DE              70607         2/1893

(Continued)

OTHER PUBLICATIONS

Amit, et al., "Photosensitive Protecting Groups of Amino Sugars and Their Use in Glycoside Synthesis. 2-Nitrobenzyloxycarbonylamino and 6-Nitroveratryloxycarbonylamino Derivatives", *J. Org. Chem.*, 39(2):192-196,1974.

(Continued)

*Primary Examiner*—David M Naff
(74) *Attorney, Agent, or Firm*—Charles E. Lyon, D. Phil., J.D.; Choate, Hall & Stewart, LLP

(57) ABSTRACT

A deformable stamp for patterning a surface. The stamp can be placed in contact with an entire 3-dimensional object, such as a rod, in a single step. The stamp can also be used to pattern the inside of a tube or rolled over a surface to form a continuous pattern. The stamp may also be used for fluidic patterning by flowing material through channels defined by raised and recessed portions in the surface of the stamp as it contacts the substrate. The stamp may be used to deposit self-assembled monolayers, biological materials, metals, polymers, ceramics, or a variety of other materials. The patterned substrates may be used in a variety of engineering and medical applications.

42 Claims, 7 Drawing Sheets

FOREIGN PATENT DOCUMENTS

| EP | 0 313 172 | 4/1989 |
|---|---|---|
| EP | 1 001 311 | 5/2000 |
| FR | 2 544 254 | 10/1984 |
| WO | WO 96/29629 | 9/1996 |

OTHER PUBLICATIONS

Dulcey, et al., "Photochemistry and Pattening of Self-Assembled Monolayer Films Containing Aromatic Hydrocarbon Functional Groups," *Langmuir*, 12,1638-1650, 1996.

Jackman, et al., "Design and Fabrication of Topologically Complex, Three-Dimensional Microstructures," *Science* 280:2089-2091, Jun. 1998.

Jackman, et al., "Electrochemistry and Soft Lithography: A Route to 3-D Microstructures," *Chemtech* 29:18-30, May 1999.

Jackman, et al., "Fabrication and Characterization of a Concentric Cylindrical Microtransformer," *IEEE Transactions on Magnetics* 33(4):2501-2503, Jul. 1997.

Jackman, et al., "Fabrication of Submicrometer Features on Curved Substrates by Microcontact Printing," *Science* 269:664-666, Aug. 1995.

Jackman, et al., "Fabrication of Three-Dimensional Microstructures by Electrochemically Welding Structures Formed by Microcontact Printing on Planar and Curved Substrates," *Journal of Microelectromechanical Systems* 7(2):261-266, Jun. 1998.

Jackman, et al., "Three-Dimensional Metallic Microstructures Fabricated by Soft Lithography and Microelectrodeposition," *Langmuir* 15(3):826-836, Jan. 1999.

Nakamura, et al., "Room-Temperature Continuous Wave Operation of InGaN Multi-Quantum-Well-Structure Laser Diodes with a Long Lifetime" *Appl. Phys. Lett.*, 70(7):868-870, 1997.

Patchornik, "Photosensitive Protecting Groups" *J. Am. Chem Soc.*, 92(21):6333-6335,1970.

Rogers, et al., "Constructing Single- and Multiple-Helical Microcoils and Characterizing Their Performance as Components of Microinductors and Microelectromagnets," *Journal of Microelectromechanical Systems* 6(3):184-192, Sep. 1997.

Rogers, et al., "Microcontact Printing and Electroplating on Curved Substrates: Production of Free-Standing Three-Dimensional Metallic Microstructures," *Advanced Materials* 9(6):475-477, 1997.

Rogers, et al., "Using Microcontact Printing to Fabricate Microcoils on Capillaries for High Resolution Proton Nuclear Magnetic Resonance on Nanoliter Volumes," *Appl. Phys. Lett.* 70(18):2464-2466, May 1997.

Rogers, et al., "Using Microcontact Printing to Generate Amplitude Photomasks on the Surfaces of Optical Fibers: A Method for Producing In-Fiber Gratings," *Appl. Phys. Lett.* 70(1):7-9, Jan. 1997.

Terrill, et al., "Dynamic Monolayer Gradients: Active Spatiotemporal Control of Alkanethiol Coatings on Thin Gold Films," *J. Am. Chem. Soc.* 122(5):988-989, Feb. 2000.

Xia, et al., "Soft Lithography," *Angewandte Chemie International Edition* 37(5):550-575, Mar. 1998.

"Lithographie mit Lichtstempeln" Technische Rundschau, Hallwag Verlag. Bern, Ch., vol. 90, No. 19, p. 20, Oct. 9, 1998.

International Search Report issued for corresponding PCT application PCT/US01/25429.

* cited by examiner

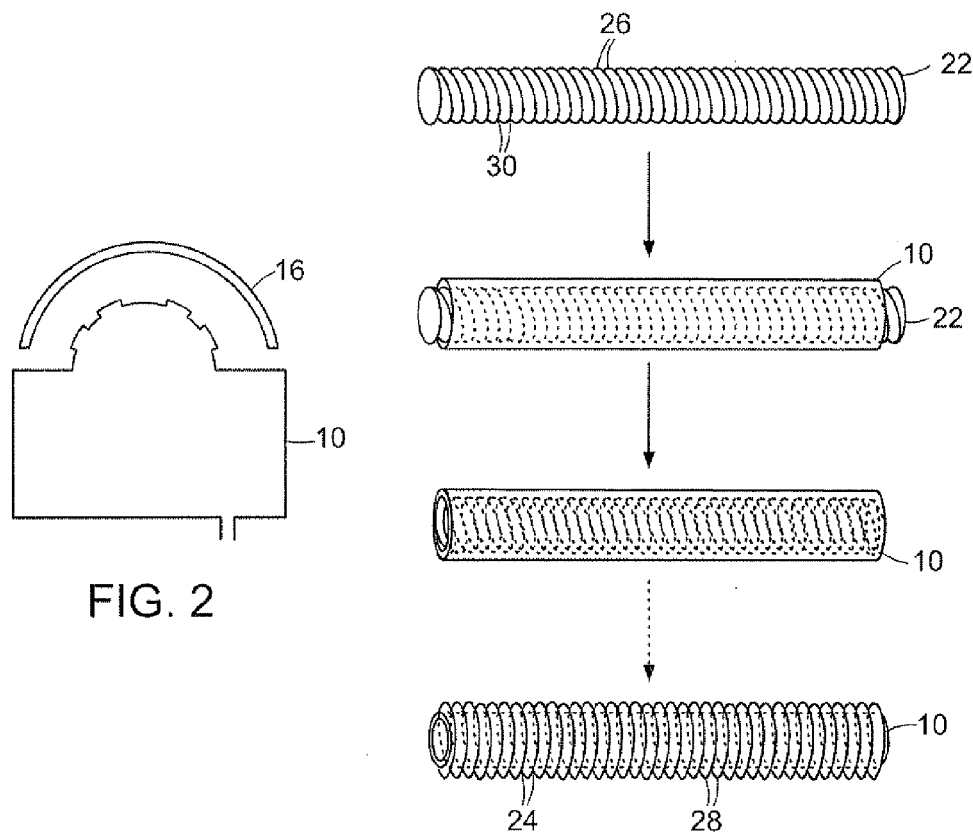
FIG. 2
FIG. 3
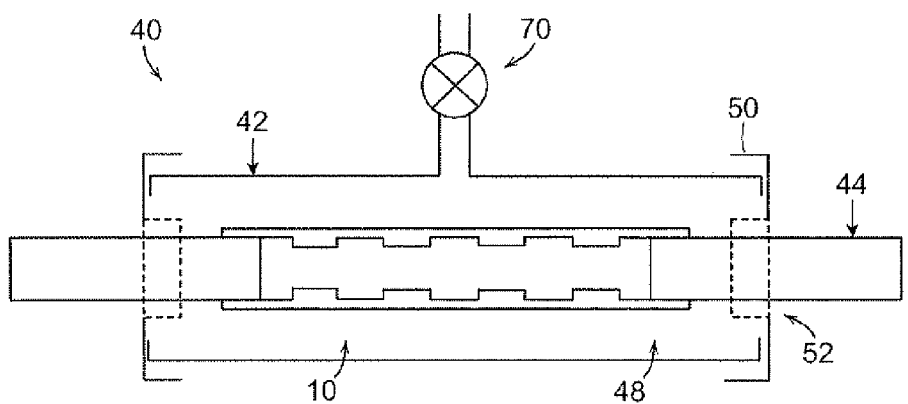
FIG. 4

METHOD OF PATTERNING A SURFACE USING A DEFORMABLE STAMP

PRIORITY INFORMATION

This application claims priority under 35 U.S.C. §119(e) to U.S. provisional application 60/225,175 filed Aug. 14, 2000, entitled Deformable Stamp for Patterning Three-Dimensional Surfaces, the entire contents of which are hereby incorporated by reference.

FIELD OF THE INVENTION

This invention pertains to a method and apparatus for patterning a surface and, more specifically, a method and apparatus through which a three dimensional surface may be stamped in a single step.

BACKGROUND OF THE INVENTION

The rapid pace of recent technological development has been made possible by improvements in microfabrication techniques. One technology that has fueled the development of microfabrication for semiconductor processing as well as other manufacturing fields is photolithography. In a typical positive photolithographic process, a mask is first placed over a silicon wafer which has been coated with a resist. The resist is then exposed to light through the mask, rendering the exposed sections of the resist non-adherent to the silicon wafer. Finally, the exposed resist is rinsed away to reveal the silicon substrate. In a negative photolithographic process, the non-exposed portions of the resist are removed. The substrate can then be processed, for example, by etching or plating, producing a pattern on the surface. However, one drawback to this process is that the initial lithographic process is limited to line-of-sight applications. In addition, traditional lithographic techniques require the use of large quantities of liquid etchants that are difficult to recycle and dangerous to dispose of. It is also difficult to vary the chemical or mechanical properties across different sections of the surface using traditional lithographic techniques. Moreover, these techniques frequently employ ion-bombardment methods that may damage the substrate. Traditional lithographic techniques are also incapable of processing large surface areas; the largest area that can be fabricated for semiconductor applications is approximately one square inch. To fabricate larger areas, a number of smaller areas must be processed and subsequently fitted together, a costly and time consuming process (c.f. U.S. Pat. No. 5,669,303).

The development of organic self-assembled monolayers (SAM) has addressed some of the problems associated with traditional lithographic techniques. These monolayers can be patterned, enabling the variation of surface properties over a given area (C. S. Dulcey, et al., *Langmuir*, 12:1638, 1996). Some methods of SAM formation involve the use of bulk solutions of the individual molecules in different solvents. The substrate on which the SAM is to be deposited is immersed in the solution, from which the molecules chemisorb or physisorb onto the substrate surface.

Another recently developed technique, contact printing, combines the advantages of self-assembled monolayers and lithographic techniques. For example, U.S. Pat. Nos. 5,512,131 to Kumar, et al., and 5,900,160 to Whitesides, et al., the entire contents of both of which are incorporated herein by reference, disclose a method of patterning the surface of a material by stamping it with a chemical species that can form a self-assembled monolayer. The surface of the stamp is coated with the chemical species and the stamp placed in contact with a surface to transfer the chemical species from the stamp to the surface, leaving a self-assembled monolayer deposited according to a pattern on the surface of the stamp. The portions of the surface that are not covered by a SAM may be etched, plated, or filled in with an additional SAM-forming species. To form a pattern on a cylindrical surface, the surface may be rolled over a planar stamp. Alternatively, a planar stamp can be used to form a pattern on a large surface by disposing it about a cylinder that is rolled over the surface to be patterned. Examples of the patterning of a cylindrical surface are described in U.S. Pat. No. 5,951,881, to Rogers, et al., the contents of which are incorporated herein by reference.

For procedures in which either the stamp or the stamped surface is rolled, alignment of the stamp with the surface is critical. If a cylindrical substrate is rolled over the stamp, the alignment of the substrate with the stamp must be precisely adjusted to ensure that, if a portion of the substrate is double stamped, then only previously stamped portions of the substrate are double stamped. Otherwise, portions of the surface which were not meant to be stamped may come in contact with the raised features of the stamp, resulting in deposition of material. For a large area stamp, the stamp must also be carefully placed to ensure that any distortion due to gravity does not result in misplacement of the stamp on the surface. A number of methods of ensuring proper alignment and stamp placement are disclosed in U.S. Pat. No. 5,925,259 to Biebuyck, et al., U.S. Pat. No. 5,669,303 to Maracas, et al., and U.S. Pat. No. 5,947,027 to Burgin, et al. Deformation of the stamp is also addressed in U.S. Pat. Nos. 5,937,758 and 5,817,242 to Maracas, et al., U.S. Pat. No. 5,948,621 to Turner, et al., and U.S. Pat. No. 5,725,788 to Maracas, et al. These inventors also describe a number of applications exploiting surfaces patterned with self-assembled monolayers. U.S. Pat. No. 6,013,446 to Maracas, et al., discloses a method and apparatus for placing a biological reagent on a substrate using contact stamping technique. U.S. Pat. No. 5,976,826 to Singhvi, et al., and U.S. Pat. No. 5,776,748 to Singhvi, et al., disclose methods and devices for forming patterned arrangements of cells and other biological materials on a surface separated by cytophobic reagents. U.S. Pat. No. 5,727,977 to Maracas, et al., discloses a method for manufacturing a field-effect device such as a transistor using contact-stamping techniques. U.S. Pat. No. 6,020,047 to Everhart discloses a method of contact printing self-assembled monolayers on metallized thermoplastic films.

There remains a need, however, for the development of methods for the stamping of three-dimensional surfaces, particularly for those methods that result in improved registration and alignment of the stamp and more efficient processing.

SUMMARY OF THE INVENTION

In one aspect, the invention is a method of stamping a surface. The method comprises providing a stamp having a stamping surface, disposing a substrate proximate to the stamping surface, and modulating the dimensions of the stamp to place the stamping surface in contact with substrate. The method may further comprise modulating the dimensions of the stamp before the step of disposing the substrate. The method may further comprise modulating the dimensions of the stamp to facilitate removal of the stamping surface from the substrate. Modulating the dimensions may comprise applying a mechanical stress or an electrical stimulus, removing a mechanical stress or an electrical stimulus, creating or venting a vacuum, applying or removing a magnetic field, or any combination of the above. The mechanical stress may comprise a positive or negative hoop stress, a tensile stress, or a hydrostatic stress. The entirety of the stamp may be modulated at the same time. At least one of the stamping surface and a surface of the substrate may exhibit convexity in at least one dimension not resulting from a surface texture or pattern. The method may further comprise exposing the substrate to electromagnetic radiation by transmitting said radiation through the stamp, portions of which may be opaque. The stamping surface may comprise a pattern comprising at least one channel defined by raised portions on the surface of the stamp. A lateral dimension of a channel or raised portion may be 100 nm or greater.

In an alternative embodiment, the method may further comprise disposing a tranferable material on the stamping surface. When the stamp is in contact with the substrate, the tranferable material is transferred to the substrate in a pattern corresponding to the pattern on the stamping surface. The transferable material may comprise a self-assembled monolayer forming molecule, protein, amino acid or nucleic acid sequence, synthetic peptide, simple or complex carbohydrate, lipid, organic or inorganic molecule, polymer precursor, organometallic complex, metal, metallic species in a solver, metal colloid in a solvent, electroless plating precursor, biological or non-biological particles suspended in a medium, or any combination of the above.

The method may further comprise placing the channel in fluidic communication with a fluid source and causing a fluid to flow from the fluid source through a path bounded by the raised portions and the substrate. The fluid may comprise an etchant, a polymer precursor, a sol-gel fluid, a metal colloid and a solvent, cells suspended in a medium, a metallic species in a solvent, a metal, an electroplating solution, an electroless plating solution, a reactive gas, or any combination of the above. In another embodiment, the fluid may comprise a solution comprising a self-assembled monolayer forming molecule, a protein, an amino acid sequence, a synthetic peptide, a simple or complex carbohydrate, a nucleic acid sequence, a lipid, an organic or inorganic molecule, a polymer precursor, and electroless plating precursor, an organometallic complex, a metallic species, cells in a medium, or any combination of the above.

The method may further comprise of adjusting the temperature of the fluid while it is in the channel or exposing it to an electric current or magnetic field, electromagnetic radiation, or ultraviolet light. The method may further comprise adjusting the temperature of the substrate while the fluid is in the channel. A lateral dimension of a channel or raised portion may be 200 nm or greater.

The method may further comprise disposing a material on the substrate before passing the fluid through the channels. A component of the fluid may interact with the material when it is disposed in the channel. The fluid may comprise a carrier and a material dissolved or suspended in the carrier, and the method may further comprise allowing the carrier to dissipate and the material to harden. The method may further comprise wetting the stamping surface with a fluid. When the stamping surface is in contact with the area to be patterned, an interaction of the substrate with the fluid may cause the substrate to develop a surface texture in a pattern conforming to the stamping surface of the stamp. The fluid may dissolve or swell the substrate, and the substrate may comprise a polymer.

The method may further comprise removing the stamp from the substrate and placing at least a portion of a second stamp against the substrate. Before placing, the method may comprise disposing the substrate in a specific position with respect to the second stamp. Disposing may comprise positioning the substrate with a micrometer stage, optically setting a mark on the substrate with respect to the stamp, or aligning a mark on the substrate with a laser. The substrate may comprise a metallic material, a semiconductor material, a ceramic, or a polymer. Alternatively, the substrate may comprise a coating of one of these materials. The method may further comprise disposing a material on the substrate before the step of placing.

The stamp may comprise a lumen having a portal providing communication between the lumen and an exterior of the stamp. The walls of the stamp defining the lumen may be characterized by flat, curved, or a combination of these. The stamp may comprise a tube or balloon. A cross section of the stamp may include two raised portions having an angular distance between 0° and 180° therebetween. The stamp may have a diameter of at least 100 µm. The stamp and the substrate may have the same or different shapes, and the stamp may be adapted and constructed to contact a substrate having an open, partially closed, or closed surface.

In another embodiment, the invention is a method of patterning a surface. The method comprises providing an elastomeric stamp having a textured surface, and placing at least a portion of the stamp against a substrate having an area to be patterned. The entire area to be patterned by the stamp is in contact with the textured surface when the stamp is placed against the substrate, at least one of the textured surface and a surface of the substrate exhibits convexity and at least one direction not resulting from a surface texture or pattern. The method may further comprise disposing a transferable material on the textured surface. When the stamp is in contact with the substrate, the transferable material is transferred to the substrate in a pattern correspondence to a pattern defined by the textured surface. The texture may comprise at least one channel defined by raised portions on the textured surface of the stamp. The method may further comprise placing the channel in fluidic communication with a fluid source and causing a fluid to flow from the fluid source into the channel along a surface of the substrate. Alternatively, the method may further comprise wetting the textured surface with a fluid. When the textured fluid is in contact with the area to be patterned, an interaction of the substrate with the fluid causes the substrate to develop a surface texture in a pattern conforming to the textured surface of the stamp. The method may further comprise exposing the substrate to electromagnetic radiation by transmitting said radiation through the stamp, wherein the texture comprises regions opaque to said radiation. The substrate may comprise a metallic material, a semiconductor material, a ceramic, a glass, a polymer, or any combination of the above, or a coating comprising any of the above.

In another embodiment, the invention is a deformable stamp having a textured surface. The stamp is arranged and constructed to adopt at least two conformations. In the first conformation, a substrate can be placed proximate to the stamp, and, in the second conformation, a textured surface on the stamp is in contact with the substrate. The stamp may comprise an elastomer. The elastomer may comprise poly (dimethylsiloxane), poly(butadiene), poly (acrylamide), poly (butylstyrene), a chlorosilane polymer, an epoxy polymer, a diglycidyl ether of bisphenol A, a polymer having an aminated aromatic backbone, a polymer having a triazine backbone, a polymer having a cycloaliphatic backbone, a co- or block-polymer of any of the above, or any combination of the above.

The textured surface may comprise at least one channel defined by a raised portion of the stamp. A lateral dimension of a channel or a raised portion may be 100 nm or greater. The stamp may exhibit convexity in at least one dimension not resulting from a surface texture or pattern. The stamp may comprise a lumen having a portal providing communication between the lumen and an exterior of the stamp, and walls of the stamp defining the lumen may be characterized by flat, curved, or a combination of these. The stamp may comprise one or two portals, or more. A cross section of the stamp may include two raised portions having an angular distance between 0° and 180° therebetween. The lumen may have a diameter of at least 100 μm. The stamp may comprise an interior and an exterior surface. Either the exterior or the interior surface may comprise the textured surface. The channel and the raised portions may each define a pattern characterized by being continuous, discontinuous, or a combination of both. The substrate and the stamp may have the same or different shapes. The stamp may be adapted and constructed to conform to a substrate having a shape selected from at least partially closed, open, multi-planar, and non-planar.

In another aspect, the invention is a method of releasing a molded polymer from a master. The method comprises swelling the polymer with a solvent, and sliding or disengaging the polymer from the master. The molded polymer has a partially closed surface. The polymer may have a relief pattern molded into at least one surface. The polymer may comprise an elastomer. The solvent may comprise dichloromethane, toluene, tetrahydrofuran, benzene, chloroform or carbon tetrachloride. The method may further comprise inverting the stamp.

In another aspect, the invention is a method of continuously stamping a substrate. The method comprises providing a stamp having an at least partially closed surface, placing the stamp in contact with a substrate, and causing relative advancement of the substrate with respect to the stamp. The stamp revolves about an axis parallel to a surface of the substrate; the stamp has a pattern defined by raised portions on a surface that contacts the substrate; and an ink is transferred from the stamp to the substrate where the substrate comes in contact with the raised portions. The pattern defined by the raised portions may be continuous with respect to a circumference of the stamp. The method may further comprise re-inking the stamp. Re-inking may comprise placing a reservoir of ink and fluidic contact with the stamp. The stamp is re-inked as it revolves. The method may further comprise choosing a speak of stamp revolution such that a re-inked portion of the stamp will dry before the re-inked portion of the stamp contacts the substrate. The method may further comprise drying a re-inked portion of the stamp before the re-inked portion contacts the substrate.

In another aspect, the invention is an apparatus for patterning a substrate. The apparatus comprises a chamber having first and second ends, wherein the chamber is in fluidic communication with a vacuum source, first and second caps sealably affixed to the first and second ends of the vacuum source, first and second rigid tubes sealably attached to the first and second ends, wherein the first and second tubes provide a conduit from an exterior of the apparatus to an interior of the apparatus, and a stamp having first and second and sealably attached to an interior and of each of the first and second rigid tubes. The caps and tubes may be removable. A lumen of the stamp is in fluidic communication with the exterior of the chamber. At least one of the seals may be effected by an o-ring, gasket, or threaded fitting. A chamber may comprise two portions that are sealably connected.

In another aspect, the invention is a photolithographic mask comprising a deformable stamp. The stamp may be at least translucent, and a textured surface on the stamp may comprise interspersed opaque and at least translucent regions. The stamp may comprise an interior and an exterior surface, and the textured surface may comprise the interior or the exterior surface. The opaque regions may be metalized, and the stamp may comprise a transparent material. The texture may comprise at least one channel defined by raised portions on the textured surface of the mask, and the opaque regions may comprise an end surface of the raised portions or walls of the channel. The texture may comprise the interspersed opaque and at least translucent regions.

In another aspect, the invention is a method of inking a stamp. The method comprises providing a re-inker having a surface and placing the surface of the re-inker in contact with a stamping surface of the stamp. Placing comprises modulating the dimensions of the stamp or contacting a portion of the stamping surface with the re-inker and a substrate to be patterned by the stamp simultaneously. The re-inker may have first and second surfaces not in fluidic communication with one another. The re-inker may be incorporated into a substrate to be patterned by the stamp or may comprise a molecular gel. The stamping surface of the stamp may be an interior or an exterior surface. Before placing the surface of the re-inker in contact with the stamping surface, the re-inker may be disposed between the stamp and the substrate or first and second portions of the re-inker may be separated along a seam and the portions disposed between the stamp and the substrate.

BRIEF DESCRIPTION OF THE DRAWING

The invention is described with reference to the several figures of the drawing, in which.

FIG. 2 depicts a balloon-like stamp configured to pattern a substrate;

FIG. 3 depicts an exemplary method of fabricating a stamp according to the invention;

FIG. 4 depicts an exemplary stamping apparatus for use with a stamp according to the invention;

DETAILED DESCRIPTION

In recognition of the need for improved stamping methods, the present invention provides methods and apparatus for patterning a three dimensional surface. In general, in one aspect, the method of the present invention involves 1) providing a stamp having a stamping surface; 2) disposing a substrate proximate to the stamping surface, and 3) modulating the dimensions of the stamp to place the stamping surface in contact with the substrate. In another aspect, the present invention provides a method of stamping a surface comprising: 1) providing an elastomeric stamp having a textured surface; and 2) placing at least a portion of the stamp against a substrate having an area to be patterned, wherein the entire area to be patterned by the stamp may be in contact with the textured surface when the stamp is placed against the substrate, and at least one of the textured surface and a surface of the substrate exhibits convexity that does not result from a surface texture or pattern. In certain preferred embodiments, the pattern comprises at least one channel defined by raised portions on the patterned surface of the stamp, and the method further comprises causing a fluid to flow into the channels along the surface of the substrate when the textured surface is in contact with the substrate. The textured surface may be coated with an ink, a material that is transferred to the substrate upon contact.

Figure 1:
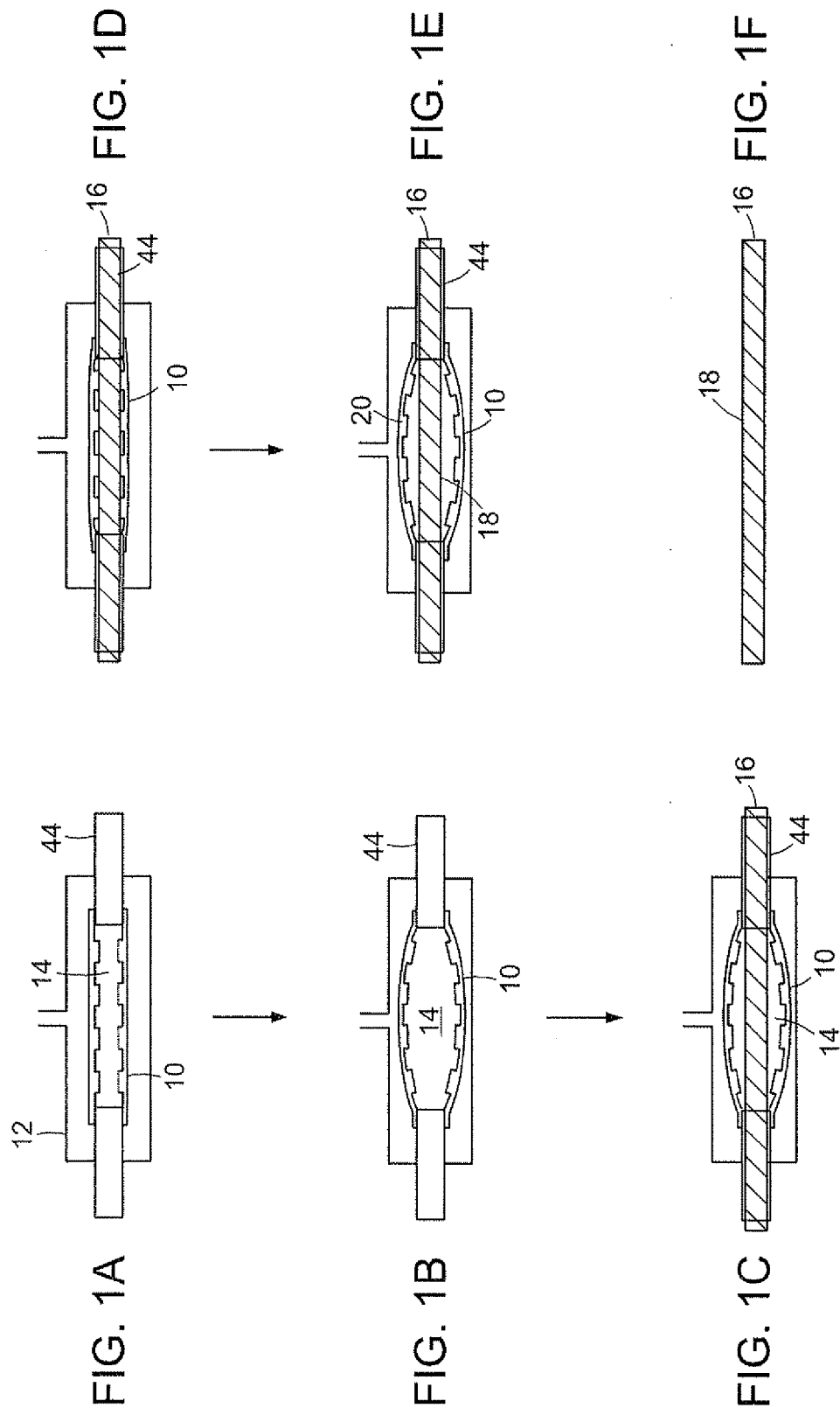
FIGS. 1A-1F depict an exemplary contact stamping method according to the invention.

FIG. 1 depicts an exemplary stamp which is configured to pattern a cylinder according to the method of the present invention as described above; however, it will be appreciated that the method of the present invention can be applied to a wide range of geometries, as discussed herein. Referring to FIG. 1, a tubular stamp 10 having a stamping surface 20 is fastened at each end to the inside of a closed chamber 12. Stamping surface 20 is formed by raised portions 28 punctuated by recessed portions 24. The stamp is deformed to increase the diameter of a lumen 14. A substrate 16 is disposed within the stamp and the deformation reversed to place raised portions 28 in contact with the substrate. If a transferable material 18 is disposed on the stamping surface 20 of the stamp prior to placing it in contact with the substrate, the transferable material will be transferred to the surface of the substrate where it contacts the raised portions 28. If flowable material is passed through the channel or channels bounded by raised portions 28 and the substrate, the material will physisorb or chemisorb to the substrate or otherwise react with the substrate material in a pattern corresponding to the channels. This concept can be expanded to pattern a variety of substrates having a wide variety of geometries and surface chemistries, as discussed in more detail below.

Certain exemplary embodiments of the present invention will be described in more detail below; however, it will be appreciated that these are not intended to limit the scope of the present invention.

Exemplary Production and Characteristics of the Stamp

As described above in the method of the invention, the patterning process begins with production of the stamp. In general, the stamp is fabricated from an elastomer cast from a master mold. The master is typically metallic but may be formed from any stiff material. For example, the master may be a glass rod electroplated with metal, a polymer, a ceramic, a composite material, or a substrate that has been coated with a resist and then patterned such that the remaining resist defines the desired pattern. It will be appreciated that the master need only be stiff enough to provide a precise mold for the material for the stamp. To produce the master, a pattern corresponding to the inverse of the pattern desired for the stamp is cut or patterned onto a blank. One of ordinary skill in the art will realize that the cutting tool may be controlled by any computer-aided design (CAD) program. A variety of techniques may be exploited for the production of the master mold. Exemplary techniques include electron discharge machining (EDM), micromachining, laser ablation, rolling microcontact printing, or electroplating, among others. The only limitations on the pattern are the resolution of the fabrication technique, the imagination of the CAD stamp designer, and the specification for the final product.

While FIG. 1 depicts a cylindrical stamp, the stamp may take practically any shape. In some embodiments, the stamp has a lumen having at least one opening from the lumen to the outside of the stamp. For example, the stamp may be tubular, having two openings into the lumen, or balloon-like, having one opening. It will be appreciated that the invention is not limited to a cylinder or a sphere or even a rounded stamp; rather, the stamp may take on any cross-section, such as an ellipse or a square. Alternatively, the stamp may have both curved and flat surfaces or only flat surfaces. A cross-section of the stamp may also be a polygon, e.g., a hexagon or an octagon, but is not limited to regular polygons. For example, the cross-section may take the shape of a many-sided polygon having a variety of different side lengths and included angles. In another embodiment, the stamp may be spherical in shape or may take the shape of a spheroid having a variety of diameter lengths. The stamp may also take the shape of a variety of other three-dimensional figures. For example, the stamp may be a polyhedron such as a cube or an octahedron. It is not necessary for the stamp to be a portion of a regular solid or have only flat or curved faces; it may take the shape of a three dimensional surface having some flat faces and some curved faces. In addition, the edge lengths and face areas need not exhibit symmetry with respect to each other. The stamp may also take a combination of shapes. For example, a portion of the stamp may be cylindrical, while another portion of the stamp defines a hexagonal tube or a portion of a sphere.

The stamp need not be the same shape as the substrate. For example, a cylindrical stamp may be employed to pattern a substrate having a square cross-section. Indeed, the substrate need not have a closed or partially closed surface; it may define an open surface without a lumen. For example, the substrate may define a portion of a sphere or spheroid or include a saddle point. The substrate may also take the shape of a variety of other open or partially closed three-dimensional surfaces. The stamp for such a surface may be formed as a balloon having a stamping surface shaped to pattern the substrate (FIG. 2).

It will also be appreciated by one of ordinary skill in the art that the stamp may be fabricated with a variety of patterns. The pattern may be defined by raised and recessed portions formed in the surface of the stamp. The outer surfaces of the raised portions eventually contact the substrate. Together with the recessed portions, they define channels for conducting fluid along a surface of the substrate. The recessed and the raised portions may each define a continuous or discontinuous pattern or a combination of these. For example, the recessed portions may define two separate networks of interconnected channels. The channels may also extend to the edge of the stamp. They may take a variety of shapes including geometric patterns of various symmetries, spirals, rings, lines, arrays of geometric shapes such as circles, squares or other two dimensional shapes, parallel or interlacing channels, or any other pattern which the practitioner can imagine. While the channels are referenced in the plural, it will be understood that the pattern may comprise a single channel or other continuous pattern. A wide variety of patterns are disclosed by the references discussed in the background of the invention and are examples that may be generated by the methods of the present invention.

Referring to FIG. 3, the stamp 10 is formed by casting the elastomeric material about the master 22. The recessed portions 24 of the stamp 10 correspond to raised portions 26 of the master 22, and the raised portions 28 of the stamp 10 correspond to recessed portions 30 in the master 22. Following casting, the stamp 10 may be swollen, e.g., with a solvent such as dichloromethane, and removed from master 22. Other suitable solvents include toluene, tetrahydroforan, benzene, hexane, chloroform, and carbon tetrachloride. Once the stamp is swollen, it may simply be slid from the master, even though the swollen raised portions 28 may exert pressure against the raised portions 26 of master 22. The stamp 10 can be easily removed from master 22 and may be inverted to place stamping surface 20 on its exterior. Following removal of the stamp, the solvent is removed from the stamp. In another embodiment, the stamp 10 is removed from master 22 by dissolving or melting the master. The master may also be coated with a non-stick material such as poly(tetrafluoroethane) (PTFE). If the raised portions 26 or 28 define a thread, the stamp 10 may simply be unscrewed from the master 22.

The stamp may be formed from any elastomer, for example, poly(butadiene), poly(dimethylsiloxane) (PDMS), poly (acrylamide), poly(butylstyrene), polymerized chlorosilanes such as methylchlorosilanes, ethylchlorosilanes, and phenylchlorosilanes, and random or block co-polymers of these elastomers. Epoxy polymers, characterized by a three-member cyclic ether group commonly referred to as an epoxy group, 1,2-epoxide, or oxirane, may also be used to form the stamp. For example, diglycidyl ethers of bisphenol A or compounds based on aromatic amine, triazine, or cycloaliphatic backbones may be used as well. The stamp may be formed of combinations of materials; however, at least the stamping surface should comprise an absorbent material selected to absorb SAM-forming solutions and other materials to be stamped. Preferably, the stamping surface is free of materials that are prone to leaching by the preferred SAM solvents of the invention.

Alternatively, the stamp itself may be fabricated from a polymer gel as disclosed by U.S. Pat. No. 5,948,621, the entire contents of which are incorporated herein by reference. In certain preferred embodiments, polymer gels having pore sizes of about 5 to about 200 nm enable the material to be stamped to flow within the gel. It will be appreciated that the gel composition may be adapted to the chemical properties of the stamped material. For example, hydrogels such as those based on acrylic acids esterified to a sugar and cross-linked polyacrylamides may be used to stamp hydrophilic molecules. Furthermore, polymers and liquid carriers may be chosen to stamp macromolecules such polymers and proteins onto a surface.

The stiffness and mechanical behavior of the stamp may be controlled by adjusting the cross-link density of the polymer by standard polymer chemistry techniques. Alternatively, the stiffness of the stamp may be adjusted by the polymer composition, molecular weight, microstructure (branched vs. linear, cross-link density, chain texture and alignment, etc.). It will be appreciated that elasticity enables the stamping surface to closely conform to the substrate and completely transfer the stamped material to minute irregularities in the surface to be stamped or non-planar or multi-planar surfaces. However, the stamp should not be so elastic such that the stamping surface flares or otherwise deforms while in contact with a substrate, resulting in blurring of the desired pattern. Addition of a backing will promote anisotropic behavior by removing a direction in which the stamp can expand or move. For example, a PDMS stamp may be backed by a stiffer elastomer. Alternatively, the stamp may be stiffened by fibers or a mesh embedded in the elastomer. The fibers may be fabricated from nylon, carbon, or other materials that can be drawn into fibers or woven One of ordinary skill in the art will appreciate that the material selected for use in fabrication of the stamp is also selected so as not to undergo substantial shape changes when the stamp is formed. For example, when a monomer or other hardenable fluid is brought into contact with the mold, curing should not expand or shrink the elastomer by more than 3-5%, preferably 1-2%, of its uncured volume. Preferably, no significant shape change should occur upon hardening. Any change in the pattern of the stamping surface should be within tolerable limits of precision for patterns transferred to the substrate surface, as defined by the specification for the final product. However, according to the method of the present invention, the stamp material may be reversibly swellable. Such swelling may facilitate removal of the stamp from the mold and be reversed upon extraction of the solvent from the stamp.

Stamping

A tubular stamp according to the present invention may be mounted in a patterning apparatus to pattern a substrate. An exemplary apparatus is depicted in FIG. 4. The apparatus 40 encloses the stamp 10 in a vacuum chamber 12. Each end of the stamp 10 is attached to a length of tubing 44 to form an airtight seal 48. Tubing 44 is preferably rigid and may be formed from metals such as brass, glass, polymers, or other suitably stiff materials. Each piece of tubing 44 is in turn attached to an endpiece 50 via an airtight fitting 52. The endpieces 50 are attached to an open-ended housing 42 in an airtight manner to form vacuum chamber 12. A variety of airtight fittings are well known in the art and may be exploited to seal the apparatus. For example, a threaded fitting may be fastened to the tubing, which then screws onto a corresponding fitting on the endpiece 50 to form airtight fitting 52. Alternatively or in addition, the stamp 10 may be glued or threadably attached to tubing 44. The various parts of the apparatus may be connected with tubular fittings which slide together and are sealed with hose clamps, o-rings, spring-loaded seals, gaskets, or similar seals. Such sealing mechanisms are well known in the art. The apparatus 40 is preferably modular, so that a single apparatus may be adapted for use with a variety of stamps 10, fittings, and end pieces 50. In another embodiment, one of the endpieces 50 may be permanently attached to housing 42, and tubing 44 may be permanently or detachably attached thereto to form a monolithic component, while the other endpiece 50, with or without tubing 44, would form a second component of the vacuum chamber 12.

If the stamp is used to deposit a material onto a surface via contact printing, it is inked with a material capable of chemisorption or physisorption onto a surface. The inking may, for example, be accomplished by contacting the stamp with a piece of lint-free paper, a cotton swab, a sponge, or other absorbent moistened with the ink, pouring the ink directly onto the stamp, or disposing the stamp about an inker in the same manner as for contact printing of a substrate (FIG. 1, described below) The ink is then allowed to dry on the stamp or is blown dry with a blower or jet so that no ink in liquid form, which may cause blurring, remains on the stamp.

For the purposes of this disclosure, the ink is the material actually deposited by the stamp and comprises the material to be deposited with or without a solvent or carrier. Following inking, the solvent is evaporated, leaving the material on the surface of the stamp to be patterned on the substrate. Any solvent into which the material dissolves or in which the material may be suspended or emulsified may be employed, but one which facilitates absorption by the stamping surface is preferred. For example, organic solvents such as ethanol, THF, acetone, diethyl ether, toluene, isooctane, etc., may be used as carriers. Ethanol is particularly preferred for PDMS stamps. The concentration of the SAM-forming compound in the ink solution may be as low as 1 µM. A concentration below 100 mM is preferred, and concentrations of 1-10 mM are particularly preferred.

After the stamp is inked, a substrate is placed proximate to it so that the stamping surface opposes the substrate surface. The process of disposing the stamp against a substrate exploits the elastomeric properties of the stamp. In the embodiment wherein a tubular stamp is used to pattern the exterior of a columnar substrate, the stamp 10 is fixed in the apparatus 40 and the stamp modulated to increase its diameter (FIG. 1B). The substrate 16 is then passed into the lumen 14 of the stamp (FIG. 1C). When the stamp 10 is released, its surface 20 is in contact with the surface of the substrate 16 (FIG. 1D). The stamp 10 is modulated again to free the substrate 16 (FIG. 1E). Preferably, the dimensions of the pattern in the stamping surface when in contact with the substrate are those of the original master. However, this is not absolutely necessary so long as the dimensions of the modulated stamp are controllable and the transferred pattern conforms to the specification for the final product.

Figure 5A:
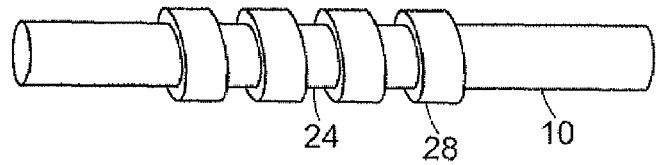
FIGS. 5A-5D depict an exemplary method of stamping the interior of a substrate.
Figure 5B:
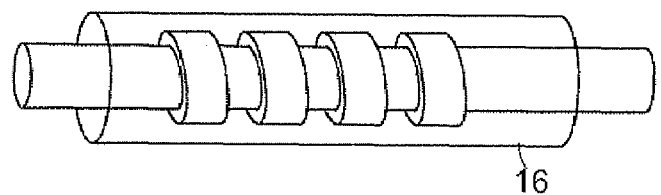
Figure 5C:
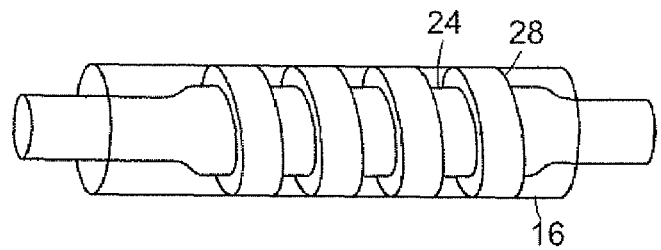
Figure 5D:
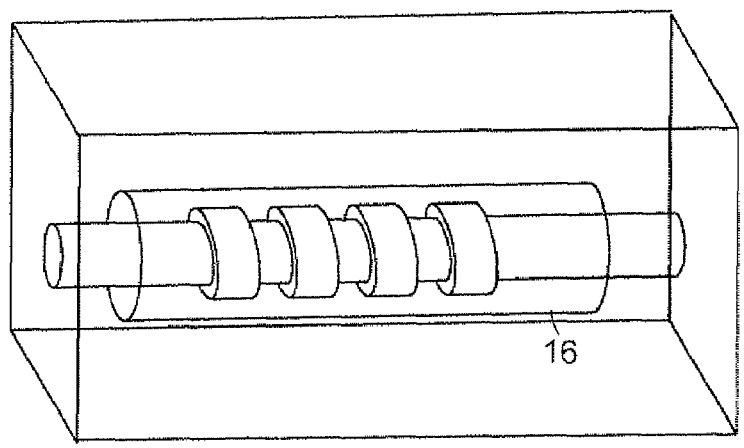

Alternatively, the substrate may be passed around the outside of the stamp and patterned on its interior. In this embodiment, the stamp 10 is passed inside a lumen of the substrate 16 and its interior lumen pressurized, expanding the stamp to place it in contact with the inside surface of the substrate (FIGS. 5A-5C). In the embodiment shown in FIG. 5, the lumen may be pressurized from both ends or may be capped at one end and pressurized from the other. The substrate is released by reducing the pressure on the lumen. Alternatively, the stamp and substrate are placed inside a vacuum chamber, the interior of the stamp sealed, and the chamber evacuated to expand the stamp against the inside surface of the substrate (FIG. 5D).

The material can be transferred to the stamping surface very rapidly. The stamp and substrate need not be held in contact for an extended period; contact times of about 1s are sufficient to deposit a SAM on a surface, although contact may be maintained for substantially longer periods of time. In addition, several stampings may be performed between inking steps.

It will be appreciated that the dimensions of the stamping surface may be modulated by a variety of methods. For the apparatus described in FIG. 4, a vacuum is applied on the stamp 10 via valve 70, causing the stamp to expand. Alternatively, if the stamp is disposed within the substrate, then the interior lumen of the stamp may be pressurized via the rigid tubing to expand the stamp against the interior of the substrate. Venting the vacuum or releasing the pressure frees the substrate from the stamp. In the case of a tubular stamp, the pressure or vacuum exerts a hoop (circumferential) stress about the circumference of the stamp. For a balloon-like stamp, the vacuum results in a hydrostatic stress.

Alternatively, the stamping surface may be formed as a thin layer on a backing comprising an electrostrictive or magnetostrictive material. The remainder of the stamp is molded on the opposing side of the backing. When a voltage or magnetic field is applied across the material, it deforms, modulating the dimensions of the stamp. If the stamp is formed from a gel, modification of the pH of a solution in contact with the gel will cause shrinkage or expansion of the stamp. Reversal of the pH change will return the stamp to its original shape.

It will be appreciated that long sections of substrate material may be processed according to the first method by repeating the modulation and release process several times, each time advancing the substrate by a predetermined interval. If it is undesirable to process a portion of the substrate twice with the same stamp, the interval should be at least as great as the length of the textured portion of the stamp. Thus, in another aspect, the present invention provides a method for the processing of large amounts of substrate in a continuous manner without cutting the substrate into sections. However, it is not necessary to produce a continuous pattern, and the substrate may be advanced to provide a small gap between patterned areas. Alternatively, a single substrate may be passed through a series of several stamps, each of which may either deposit or enable fluidic patterning of the substrate with a different pattern or ink.

Multiple or batch stamping processes may require careful alignment and placement of the substrate with respect to the stamp. For example, a mark may be placed on the substrate which enables it to be aligned with respect to the stamp optically, for example, with a laser. Alternatively, a robotic system or micrometer stage may be used to precisely advance the substrate in the apparatus or series of apparatuses.

Figure 6A:
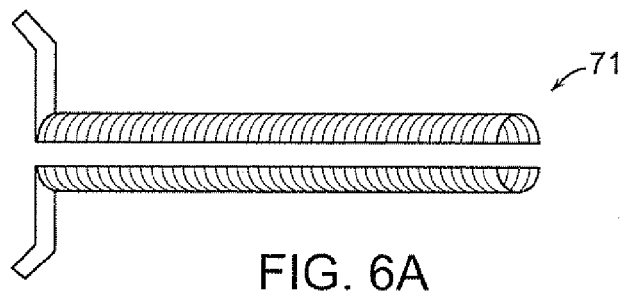
FIG. 6 depicts an exemplary method for re-inking a stamp.
Figure 6B:
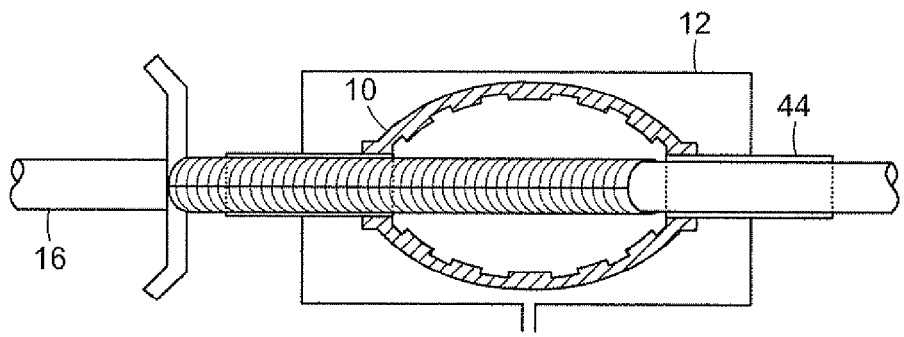
Figure 6C:
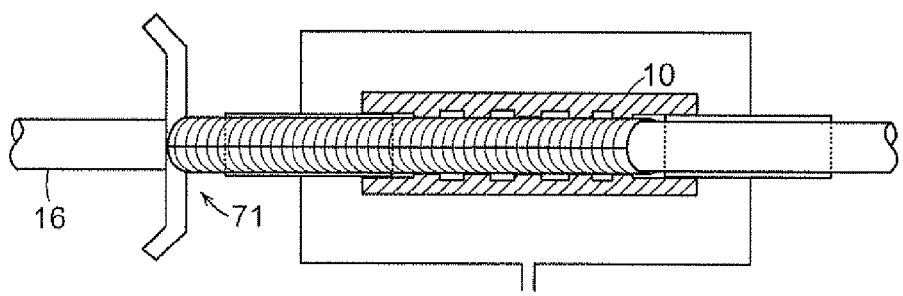
Figure 7:
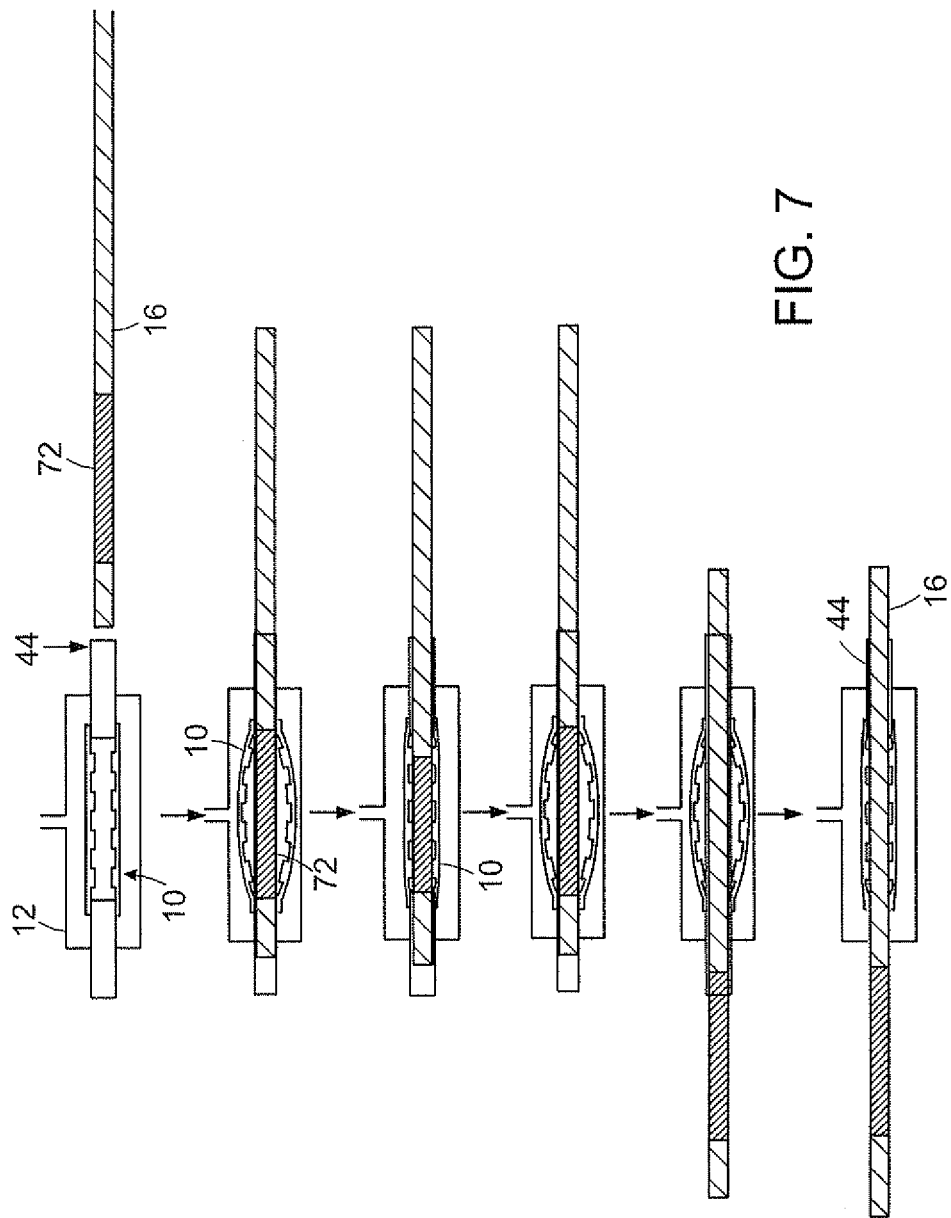
FIG. 7 depicts an exemplary method for re-inking a stamp.

In addition, during a continuous stamping process, the stamp itself must be re-inked. This may be accomplished by a variety of techniques. Of course, the substrate material may be removed from the apparatus, for example, by cutting the substrate material between the processed and unprocessed portions and inking the stamp as described above. In another embodiment, an inker having an exterior diameter greater than the substrate but less than the interior diameter of the modulated stamp (or vice versa, depending on whether an interior or an exterior surface of the surface is being stamped) may be passed into the apparatus. The surface of the inker opposed to the substrate is fabricated from a "leak proof" material to prevent ink from contacting the substrate. The stamp is allowed to contact the inker and is then modulated so that the inker may be removed. For applications where a substrate is stamped several times, or where it is undesirable to cut sections of the substrate following stamping, the inker 71 (FIG. 6A) may be formed in two sections which fit around the substrate 16 for insertion into the stamp 10 (FIGS. 6B and 6C). In another embodiment, an inking segment 72 may be incorporated into the substrate or wrapped around it. As the substrate is advanced, the stamp will alternately stamp the substrate and be re-inked (FIG. 7).

In another embodiment, a molecular gel may be disposed about the non-stamping portion of the stamp. Such a gel may be polymerized in situ or fabricated separately and placed against the stamp. For example, the gel may be a cylinder arranged concentrically within or outside of the stamp, depending on where the stamping surface is located. The gel acts as a reservoir, and, because it is distributed over the entirety of the stamp, it reduces the diffusion length the ink must traverse to reach the stamping surface. The ink for the gel may in turn be replenished according to any of the techniques described thus far. Alternatively, the stamp may be placed in fluidic communication with a reservoir of ink and the ink allowed to diffuse into the gel.

The use of a polymer gel for contact printing enables the stamp to be re-inked from its exterior. The material to be stamped is transported to the exterior of the stamp and flows through its pores to the stamping surface, obviating separation of the stamp, which creates a seam which may make modulation of the stamp's dimensions more difficult. An inker similar to that described in the above paragraph may still be used to resupply the gel from its exterior—such an inker would not require an ink-impermeable "leak proof" surface.

Figure 8:
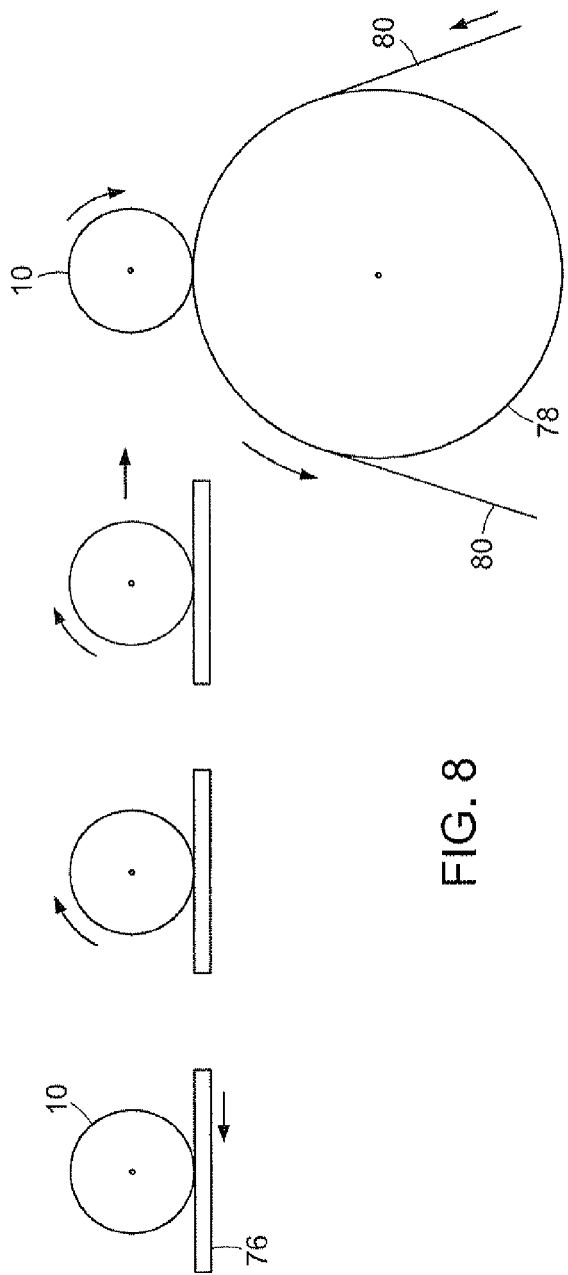
FIGS. 8A-8D depict the motion of a roller and a substrate for rolling microcontact printing.

The stamp may also be employed to print a large area of substrate with a continuous pattern. Instead of placing the stamp 10 in apparatus 40, it is mounted on a rotor and placed in contact with a substrate 76. The substrate is advanced against the stamp and the stamp rotated to match the advance (FIG. 8A). The stamp may also be rotated and the substrate translated to match its rotation, or the stamp may be rotated and translated on a fixed substrate, as depicted in FIGS. 8B and 8C, respectively. Alternatively, the stamp may be used to pattern a cylinder 78 or a material 80 being reeled along a cylinder (FIG. 8D) (c.f. U.S. Pat. No. 5,925,259). The continuous motion of the stamp results in the patterning of an area many times the actual surface area of the stamp. Because the stamp is fabricated as a tube, it can print a continuous pattern without interruption from a seam, which would result if a flat stamp were rolled into a cylinder. The stamp can be re-inked as it is stamping by placing a reservoir of ink, such as a roller, in contact with the stamp. The volatility of any solvent in the ink and the speed of rotation of the stamp should be optimized so that the solvent evaporates before the re-inked portion contacts the substrate. Alternatively, a dryer may be disposed between the reservoir and the substrate to dry the stamp.

The resolution of the techniques embodied by the instant invention is defined by two variables: first, the resolution of the pattern, and second, the size of the stamp. The stamp can be fabricated to produce a pattern having a resolution ranging from several centimeters to a micron or less, e.g., 500, 200, or 100 nm. For example, patterns having a resolution of 100 μm may be used to adhere single cells. The stamp itself can be fabricated with an interior diameter of as little as 100 μm. Of course, if the stamp is not cylindrical, then portions of the stamp may be less than 100 μm across. The interior diameter of the stamp may range up to several centimeters. In addition, stamps may be fabricated with lengths of 30 cm or more because the spherical or tubular shape of the stamp provides mechanical support. The only limit on the size of the stamp is the ability to produce an apparatus which can contain it. Longer stamps may need to be supported at intervals to prevent them from sagging under their own weight.

The resolution of the stamp also determines the optimal height of the raised features of the stamp. The raised features should be approximately the same size as the smallest feature of the stamp. However, the raised and recessed portions may have very different dimensions. For example, a stamp may have raised portions measuring 50 μm across with recessed portions only 1 μm across.

The resolution of the stamp in traditional planar printing techniques is also limited by the diameter of the substrate when printing on curved substrates. Traditional planar stamping techniques have difficulty placing widely disbursed patterns on small diameter objects. If the diameter of a tubular substrate is less than the distance between raised portions on the stamp, then the substrate will actually fall in the channels and get stuck. On the other hand, such a substrate may be patterned in a single step by the processes of the instant invention. Indeed, if one desired to pattern a cylindrical substrate with two lines of deposited material extending longitudinally on opposite sides of the cylinder, one could produce such a pattern in a single step using the techniques of the invention.

The stamp in turn may be used to deposit a plethora of materials on substrates drawn from all classes of materials, including metals, ceramics, glasses, semiconductors, polymers and composites. The substrate may also include a coating comprising, for example, any of these materials or composites thereof.

In one embodiment, the stamp may be used to deposit materials which form self-assembled monolayers. Such molecules generally have at least three sections. The anchor section of the molecule forms a bond with the substrate, attaching the entire molecule thereto. Adjacent to the anchor is a tether that acts as a spacer and is generally inert with respect to subsequent processing steps or interactions, although it is not required to be so. Any tether that does not disrupt SAM packing and that allows the SAM layer to be somewhat impermeable to various reagents (e.g., etchants) or organic or aqueous environments is suitable. The tether may be polar, non-polar, halogenated (e.g., with fluorine), positively charged, negatively charged, or uncharged. For example, a saturated or unsaturated, linear or branched alkyl, aryl, or other hydrocarbon spacer may be used. Any combination of these functional groups may also be used in the tether. Exemplary tethers include long chain (e.g., $C_4$-$C_{17}$ or more) hydrocarbon groups. A terminal group is at the opposite end of the molecule, adjacent to the tether, and comprises a functionality which confers a specific surface property on the assembled monolayer, which functionality is typically exposed when the SAM is formed. Terminal groups with hydroxyl or amine moieties will tend to be hydrophilic, while halogenated and aliphatic groups will tend to be hydrophobic. Aromatic groups contribute to specific chemical interactions and are also photoactive. Alternatively, if no specific terminal group is chosen, the end of the tether essentially forms the terminal group. For example, hydrocarbon tethers present a methyl terminal group, while a halogenated or hydroxylated hydrocarbon will present a halogenated or hydroxylated terminal group. Alternatively, a functional group exposed at the surface of the SAM, but which is not the terminal end of a SAM-forming molecule, may be the terminal group.

The anchor group chosen for the SAM will depend partially on the substrate material. For example, organosilanes may be deposited on silicon, glass, fused silica, or any substrate with an oxidized surface. Carboxylic acids may also be used as anchors to oxidized substrates such as silica, alumina, quartz, glass, and other oxidized surfaces, including oxidized polymeric surfaces. Metals such as gold, silver, copper, cadmium, zinc, palladium, platinum, mercury, lead, iron, chromium, manganese, tungsten, and alloys of these may be patterned by forming thiol, sulfide, and disulfide bonds with molecules having sulfur-containing anchor groups. In addition, molecules may be attached to aluminum substrates via a phosphonic acid ($PO_3^{2-}$) tether. Nitriles and isonitriles may be used to attach molecules to platinum and palladium, and copper and aluminum may be coated with a SAM via a hydroxamic acid. Other functional groups available suitable for use as anchors include acid chlorides, anhydrides, sulfonyl groups, phosphoryl and phosphonic groups, hydroxyl groups, and amino acid groups. Of course, SAMs may be deposited on semiconductor materials such as germanium, gallium, arsenic, and gallium arsenide. Unoxidized polymeric materials, especially those having electron-rich elements in their backbones or side chains, may also be used as substrates. Exemplary materials include epoxy compounds, polysulfones, acrylonitrile-butadiene-styrene copolymers, and biodegradable polymers such as polyanhydrides, polylactic acid, polyglycolic acid, and copolymers of these materials. Non-conductive materials may also be used as substrates.

A wide variety of chemical groups may serve as the terminal portion of the SAM. The terminal group may be hydrophobic or hydrophilic or selectively bind various biological or other chemical species. For example, ionic, non-ionic, polar, non-polar, halogenated, alkyl, aryl or other functionalities may be exploited as part of the terminal group. A non-limiting, exemplary list of such functional groups includes those employed as tether groups as well as: —OH, —CONH—, —CONHCO—, —$NH_2$, —NH—, —COOH, —COOR, —CSNH—, —$NO_2^-$, —$SO_2^-$, —RCOR—, —RCSR—, —RSR, —ROR—, —$PO_4^{3-}$, —$OSO_3^{-2}$, —$SO_3^-$, —$PO_3^{2-}$, $NH_xR_{4-x}^+$, —$COO^-$, —$SOO^-$, —RSOR—, —$CONR_2$, —$SO_3H$, —$(OCH_2CH_2)_nOH$ (where n=1-20), —$CH_3$, —$PO_3H^-$, —2-imidazole, —$N(CH_3)_2$, —$NR_2$, —$PO_3H_2$, —CN, —$(CF_2)_nCF_3$ (where n=1-20), olefins, hydrocarbons, etc. In the above list, R is hydrogen or an organic group such as a hydrocarbon or fluorinated hydrocarbon. As used herein, the term "hydrocarbon" includes aliphatic, aromatic, cyclic, polycyclic, unsubstituted, and substituted organics, e.g., alkyl, alkenyl, alkynyl, cycloalkyl, aryl, alkaryl, aralkyl, etc. The hydrocarbon group may, for example, comprise a methyl, propenyl, ethynyl, cyclohexyl, phenyl, tolyl, naphthyl, and benzyl group. The term "fluorinated hydrocarbon" is meant to refer to partially and fully fluorinated derivatives, in addition to perfluorinated derivatives of the above-described hydrocarbon groups. A wide variety of functionalities that may be used to modify the chemical properties are described in U.S. Pat. No. 5,776,748, the entire contents of which are incorporated herein by reference.

Materials may also be stamped directly on the surface rather than through SAMs or via a tether. For example, precursor colloids for electroless plating may be deposited. Methods for printing such colloids are disclosed in U.S. Pat. No. 6,060,121, to Hidber, et al., the entire contents of which are incorporated herein by reference. Alternatively, metals may be deposited directly or via SAMs that include one or more chelating agents. Particles such as latex beads may be suspended in a solvent and stamped on the surface, as may inorganic, metallic, and organometallic species that can physisorb or chemisorb to the substrate.

Biological molecules or molecular fragments may also be patterned on a substrate using the techniques of this invention. Such molecules may be incorporated into an ink and directly stamped onto a polystyrene or other polymeric substrate to which the biological molecule adheres. The stamp is placed against the substrate and held there until the molecules have adhered through physical or chemical interactions to the substrate. Exemplary molecules include extracellular matrix proteins such as fibronectin, collagen, and laminin, albumin, amino acid sequences, cell adhesion sequences such as -R-G-D-, synthetic peptides, various proteins and enzymes, and sugars such as lectin binding sugars. Biological molecules that form SAMs may be deposited directly onto the substrate. All of these molecules may be anchored to the surface via a separate functionality, such as a silane or thiol attached to the molecule via a tether. Proteins may also be immobilized via hydrophobic interactions. Molecules may also be chosen that have specific receptors, such as antibodies and antigens, cell surface receptors and ligands, etc. These molecules may modify a surface, enabling the immobilization of biological molecules, molecular fragments, cells, or cell components. In addition, a variety of biological materials can be used to prevent the attachment of others. For example, intact and fractionated cells and organelles, lipids, simple and complex carbohydrates, and some proteins and nucleic acids have a low affinity for biological molecules and cells. Many of the organic molecules described above also discourage adherence of biological materials. The '446 patent describes additional methods of depositing biological materials such as oligonucleotides on a surface. The '748 patent provides additional methods of modifying deposited materials to alter their properties.

It will be appreciated by one of ordinary skill in the art that the substrate may be modified before deposition of the desired molecule. For example, both metallic and non-metallic surfaces may be oxidized. The surface of a polymeric material may be stiffened by increasing the cross-link density, for example, by exposure to ultraviolet light. Ion bombardment may be used to modify the surface chemistry of a variety of materials. In addition, surfaces may be coated completely with a resist or other material which is then patterned by the stamp. Any biological, non-biological, organic, or inorganic material, or a combination of any of these, may be used as a surface modifier. For example, polymeric or metallic coatings may be employed. While the substrate of the present invention generally comprises a smooth surface, this is not required, and surface modifiers may be deposited to form various surface textures such as particles, strands, precipitates, gels, sheets, tubing, spheres, containers, capillaries, pads, slices, films, slides, etc. The substrate may additionally include a bonding layer, e.g., a thin titanium or chromium film, to promote adhesion between the surface material and the underlying substrate. The penetration depth or coating thickness may be adjusted depending on the modification technique, coating material, or the desired application. For example, the amount of material altered by ion bombardment depends on both ionic energy and exposure time.

Figure 9:
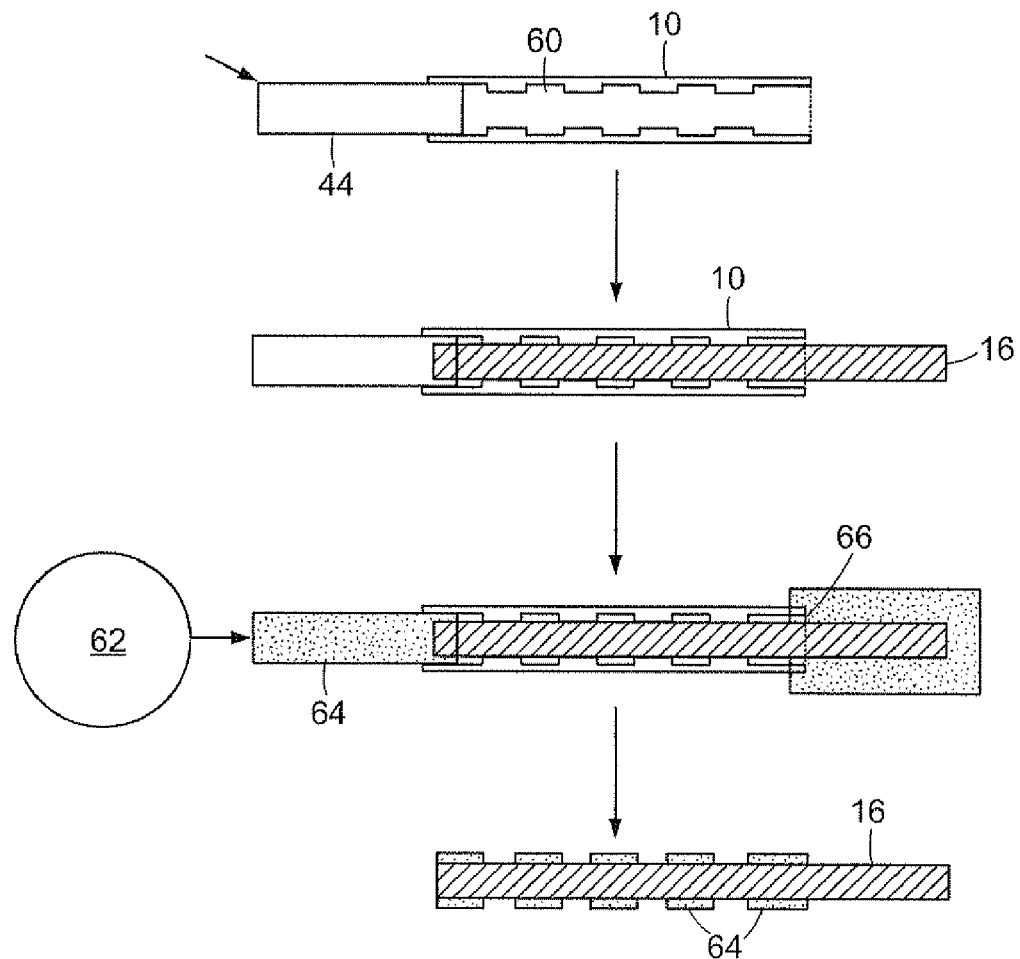
FIG. 9 depicts an exemplary fluidic patterning method according to the invention.

The stamps of the invention may also be used for fluidic patterning. In one embodiment, a stamp 10 having a continuous pattern of channels 60 is placed against the substrate 16 (FIG. 9). The channels are connected to a fluid source 62 from which fluid 64 can pass through the channels 60 and exit the stamp at a second location 66. Fluid 64 may enter and exit the channels 60 via tubing 44. The raised portions of the stamp confine the fluid to a path along the substrate defined by the channels. A variety of fluids may be flowed across the surface of the substrate in this manner. For example, the surface may be plated by use of a metal solution, or a resist may be passed through the stamp to protect portions of the substrate from plating, etching, or other processing steps, or a reactive gas may be circulated through the channels to chemically alter the substrate surface. Conversely, a metal may be removed by flowing an etchant through the channels. Alternatively, a solution containing SAM-forming molecules may be flowed across the surface to create a monolayer. Indeed, materials that may be stamped on the surface may also be deposited via fluidic patterning. The resolution of the technique is determined partially by the viscosity of the fluid passing through the channels. Resolutions of 200 nm or even less may be achieved, especially for gases.

Fluidic patterning can exploit many of the advantages of bulk deposition from a solution while using smaller quantities of material. In but one embodiment, electroless plating may be performed by passing an activating agent such as a palladium, gold, or platinum colloid through the channels 60 or even coating the entire substrate with the agent before placement of the stamp. Following deposition of the activating agent, the portions of the substrate unprotected by the stamp may be metallized. The process may be repeated to deposit a series of layers on the substrate. In addition, a sensitizing agent such as a palladium, tin, or copper halide may be flowed through channels 60 before (or in place of) patterning the colloid or used to coat the entire substrate. In another embodiment, if the activating agent is patterned on the surface either fluidically or via contact printing, the entire substrate may be subsequently immersed in the metallization solution, or the surface may be metallized with a plurality of metals in a pattern defined by one or more stamps. Besides palladium colloids and other activating agents, colloids of other materials may also be deposited on the surface via fluidic patterning, as disclosed by the '121 patent. As the solvent evaporates or is otherwise dispersed from the colloid, either before or after removal of the stamp, the suspended particles form a network on the substrate surface. Biological materials may also be deposited on the substrate through fluidic patterning techniques. Indeed, if a surface is previously prepared with a specific receptor, fluidic patterning may be used to selectively deposit one molecule out of a solution which may contain many biological species. In addition, reactive gases may also be passed through the channels to react additively or subtractively with the surface of the substrate. Alternatively, if a magnetic material is to be deposited on the substrate, it may be desirable to expose the material to a magnetic field as it is flowed over the substrate, resulting in a permanent magnetic field in the deposited material.

In addition, materials may be fluidically patterned on the substrate via sol-gel processes. A precursor, typically an organometallic compound or an inorganic salt, is subjected to a series of hydrolysis, condensation, and polymerization reactions. The resulting "sol," a suspension of macromolecular particles in a liquid carrier, is patterned on the substrate and allowed to condense into a gel phase. Further drying and heat treatment converts the gel into a solid phase. The chemical processes which make up the sol-gel method are well known in the art and are described, for example, in *The Physics and Chemistry of Sol-Gel Processing*, by Brinker, et al. (New York: Academic Press, 1990), the entire contents of which are incorporated herein by reference.

A variety of materials with flowable precursors may also be patterned on a substrate via fluidic techniques. Polymers may be patterned on the substrate by flowing a liquid pre-polymer or monomer through the channels and exposing it to ultraviolet light through a transparent stamp. Self-curing polymers such as epoxies may also be patterned on the surface. In another embodiment, the fluid passed across the substrate may be exposed to an electric or magnetic field or heated. For example, a heated fluid may be passed through the network of voids, and it is also possible to heat the fluid directly as it passes over the substrate. For example, a metallic substrate may also serve as a heater through resistive heating, or the entire apparatus may be heated, for example, in an oven or radiatively. Sol-gel techniques may be exploited to form ceramics and other materials with the channels in the stamp serving as a mold for the sol. Colloids, inorganic materials, hybrid organic/inorganic materials, and biological materials can also be molded on the surface. The material is dissolved or suspended in a solvent and passed into the network of voids, following which the solvent is allowed to dissipate, leaving the molded material behind. The material may be cross-linked or crystallized as the solvent is dissipated. Other techniques for hardening flowable material in capillaries may also be exploited for use with the stamps of the invention. Exemplary techniques are described in U.S. Patent No. 6,004,444 and Xia, et al., "Soft Lithography," *Angew. Chem. Int. Ed*, 37:550-575(1998), the entire contents of both of which are incorporated herein by reference.

Because the fluid is circulated from an inlet to an outlet through the channels defined by the raised portions of the stamp, fluidic patterning may also be exploited to perform electrochemical reactions on the substrate surface. For example, a metal or other conductive material may be electroplated on a substrate by establishing a current through the flowing material. The conductive substrate serves as one electrode, and a counter electrode is placed in the reservoir which feeds the solution through the network of voids. Alternatively, the counter electrode may be disposed in a reservoir where the used plating solution is collected. Materials may also be galvanically removed from the substrate by reversing the voltage.

Indeed, fluidic patterning techniques may be applied to a variety of applications where nothing is deposited on the surface. For example, a stamp may be disposed on a substrate having a catalytic surface, for example, platinum, and a fluid containing the reagents for a chemical reaction passed through the channels. The unreacted molecules are fed into the channels on the stamp and emerge as the reaction product. Similarly, a surface coated with a particular enzyme, for example, a protein kinase, may facilitate a biological reaction.

Additionally, the substrate surface may be patterned via stamping or fluidic patterning, or both. The stamp may deposit one material via contact printing and provide a path for fluidic patterning simultaneously. Because SAMs are autophobic, that is, they repel additional molecules of the same composition to prevent the formation of a second layer, the stamp can be left in contact with the substrate surface for extended periods of time.

The techniques of the invention can also be used for solvent-assisted micromolding (SAMIM). The stamp is wetted with a material that is a good solvent for the substrate, which may be polymeric. When the stamp contacts the substrate, the solvent either swells or dissolves a thin layer of the substrate material, causing it to conform to the pattern of the stamping surface. Once the solvent dissipates, the polymer solidifies to form a relief having a pattern complimentary to that of the stamp. SAMIM can be used to mold the substrate in a variety of patterns; the patterned substrate may be further processed via contact printing, fluidic patterning, or other surface modification techniques such as oxidation. Appropriate solvents for swelling polymeric substrates include those that can be used to swell the stamp and other organic solvents and are selected for the particular substrate. For example, acetone is a good solvent for polystyrene, and toluene is appropriate for use with polycarbonate.

Figure 10:
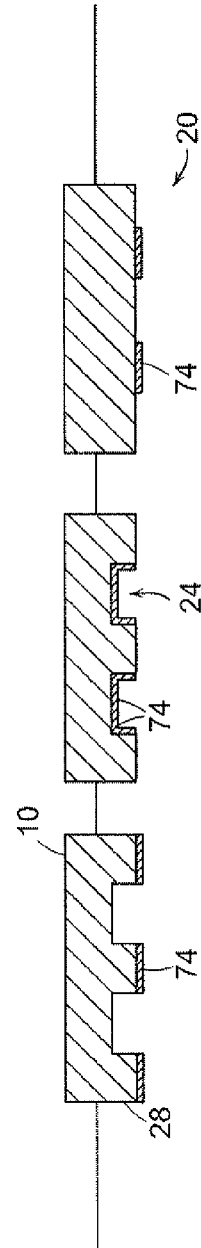
FIG. 10 is a cross-sectional view of lithographic masks fabricated according to an embodiment of the invention.

In another embodiment, the stamp may be used as a mask, for example, for photolithography. The stamp is metallized with the desired pattern, for example, by electroless techniques or etching, to form a mask. Such a mask may be fabricated by the techniques of the invention. For example, a metallic or other opaque coating 74 may be deposited on the ends of the raised portions of the stamp or the interior walls (including the sides and bottoms) of the recessed portions (FIG. 10). However, the pattern is not necessarily defined by raised and recessed portions; rather, the pattern is defined by the metallized and blank portions of the stamping surface. Thus, in an alternative embodiment, the stamp may be fabricated as a smooth cylinder and the opaque coating 70 patterned on the surface using the techniques of the invention. The stamp is placed in contact with a substrate, which is then irradiated through the stamp. The substrate may be disposed within or without the stamp and is preferably in contact with the plated portion of the stamp. It may be more convenient to pattern the exterior of the stamp, following which it is inverted as described above, so that the patterned surface of the stamp is in contact with the substrate during irradiation.

Uses and Processing of Patterned Surfaces

One of ordinary skill in the art will realize that, once the surface of the substrate has been patterned, it may be processed in a variety of ways. In one embodiment, the deposited material itself can be chemically modified. For example, functional groups at the surface of monolayers may be further functionalized, i. e., by the addition of an amine to a carboxyl-terminated molecule. Alternatively, functionalities containing aromatic groups may be modified photoactively. For example, phenyltrichlorosilane films become detached from a substrate when exposed to intense violet radiation. A SAM-forming compound may include an exposed functionality including a protecting group that may be removed to effect further modification of the SAM. For example, a photoremovable protecting group may be selected such that it may be removed without disturbing of the SAM of which it is a part. Such protective groups may be selected from a wide variety of positive light-reactive groups, e.g., nitroaromatic compounds such as o-nitrobenzyl derivatives or benzylsulfonyl. Photoremovable protective groups are described in, for example, U.S. Pat. No. 5,143,854, issued Sep. 1, 1992, and incorporated herein by reference, as well as articles by Patchornik (*J. Am. Chem Soc.*, 92:6333, 1970) and Amit, et al. (*J. Org. Chem.*, 39:192, 1974), the contents of both of which are incorporated herein by reference. Alternately, a reactive group may be provided that may be activated or deactivated by electron beam lithography, x-ray lithography, photolithography, or any other radiation patterning method. Reactive groups, especially acids, bases, and biological molecules, may also be activated or deactivated chemically, for example, by a change in pH. Such protections and deprotections may aid in chemical or physical modification of an existing surface-bound SAM, for example in lengthening existing molecular species forming the SAM. Such a modification is described in the '854 patent.

In addition, the surface of the substrate may be modified by adding material to either the patterned or the blank portions of the substrate. Exemplary modifications such as electroless plating are discussed above. In another example, cells or other biological materials may be patterned on the substrate. If the pattern comprises a relatively hydrophilic material (e.g., a metallic substrate or an aminated terminal group) separated by hydrophobic patches (e.g., a polymer substrate or methyl—terminated group), hydrophilic molecules such as DNA will deposited selectively on the hydrophilic portions of the substrate. In contrast, if the patterned material is relatively cytophilic (e.g. matrix protein), then cells or cell membrane materials will attach selectively to the patterned portions of the substrate. The specificity of attachment of biological materials may be increased by patterning specific proteins or receptors on the substrate surface. A variety of organic and inorganic materials may also be deposited on appropriately patterned surfaces. For example, a surface patterned with ethylenediaminetetraacetic acid (EDTA) may be used to facilitate selective deposition of iron or other metals onto the substrate. Hydrophilic molecules, such as those containing oxygen or nitrogen, will selectively attach via electrostatic forces to the hydrophilic portions of an appropriately patterned substrate. For example, these molecules will selectively deposit on the sections of a plastic substrate patterned with a hydrophilic SAM and the unpatterned sections of a metallic substrate patterned with a hydrophobic SAM. Alternatively, two SAMs having tethers of different lengths or different terminal groups may be patterned on a surface to vary its chemical and/or topological characteristics. Topological variation can be exploited to laterally stabilize cells or facilitate chemical reactions. Patterned material, such as SAMs, polymers, and plated metals, may also be used as a resist to prevent etching of the underlying substrate. The unpatterned portions of the substrate may then be partially or completely removed through the use of appropriate etchants.

It will also be appreciated that these stamps and methods described herein have applications in a variety of fields including biology, chemistry, physics, medicine, and engineering. Some of the chemical applications such as microanalysis and microcatalysis have already been discussed above in connection with fluidic patterning. The techniques of the invention can be used to produce microelectrodes in a variety of configurations by metallizing selected portions of a non-conductive substrate or by etching selected portions of a metallized substrate. For instance, an electrode may be fabricated with two interdigitating electrodes. A material placed across the electrodes will complete the circuit and produce a reading on a volt- or ammeter if it is conductive. These electrodes can also be used in a variety of medical applications. For example, it is well known that electric current run along the surface of an endoscope has anti-bacterial properties. While the source of the anti-bacterial activity is not completely understood, disposing an electrode on a catheter or endoscope to create the effect is a basic application of the techniques of the instant invention. In addition, the size of the electrodes can be modified along the surface of the endoscope.

In but one example, the electrodes may be configured to provide resistive heating at the end of the endoscope. Many endoscopic procedures, such as sigmoidoscopy, use dual purpose catheters which can be used to both visualize tissue inside the body and perform a second function such as taking a biopsy. A catheter equipped with an electrode can be used to visualize tissue and remove diseased material, such as a polyp, by burning it off, much as a dermatologist burns a mole off a patient's skin. Alternatively, electrodes on an endoscope may be used to do in situ chemical analysis within the body. As before, an analyte flowing across interdigitating electrodes will complete the circuit between them, resulting in a measurable electrical current or voltage. Electrodes disposed on an endoscope may also be used to induce electroluminescence in a tissue or fluid. Electrical voltage transmitted through the electrode stimulates luminescence in the fluid which can then be detected by a fiber-optic cable disposed within the endoscope. Of course, electrodes may be used to directly measure electrical activity inside a body, for example, in the brain, or the metallized catheter may be employed as an antenna. If the catheter is partially metallized in the pattern of a tight coil, it can also serve as an inductor. Instead of receiving power directly, the components patterned onto the catheter can be powered via inductive coupling with a power source external to the patient. The principle of inductive coupling is based on the behavior of a coil, in which a magnetic field will be induced when electrical current is passed through the coil, and vice versa. The current induced in the catheter can be used to perform any of the techniques described above or any other technique where it is desirable to deliver current to a patternable device in a patient.

Ligands such as antibodies or DNA may also be disposed on the surface of an endoscope. The coated section of the endoscope may be sheathed until it has reached the area of interest, at which the ligands will be exposed to the local environment. These ligands can then be used to detect the presence of a variety of analytes at a specific site in the body. Alternatively, radioactivity detectors may be disposed on the surface of the endoscope to detect the presence or absence of a radioactive label that had previously been injected into a patient.

In addition to short-term medical devices such as the endoscope described above, long-term medical devices such as coronary stents may also be fabricated according to the techniques of the invention. Indeed, the fabrication of a stent is one of the basic applications of the techniques that enable the patterning of a cylinder. A stamp is fabricated having the pattern desired for the stent. The size of the various raised portions of the stamp are adjusted to allow the final product, the stent, to expand and contract along microjoints defined by the patterning. A resist is patterned on the surface of a substrate and the unpatterned substrate completely etched to leave a mesh matching the pattern of the original stamp. Material is deposited on the mesh to increase its thickness and optimize the mechanical and structural properties of the completed stent. The surface is then modified to improve biocompatibility. For example, the surface may be coated with a molecule to prevent blood clots or the adhesion of lipoproteins or plaque. Alternatively, the stent may be coated with molecules that promote specific cellular activity in that section of the artery. The substrate is removed and the completed stent inserted into an artery. The order of these steps may be changed. For example, the substrate may be removed before the biological coatings are deposited, enabling the interior and exterior surfaces of the stent to be coated.

In addition, the techniques of the invention can also be used to produce scaffolds for tissue engineering applications. Either contact printing or fluidic patterning may be exploited to pattern surface modifying materials on a variety of scaffolds. Both cell adhesion proteins and regulatory agents, in addition to integrins, cell adhesion sequences such as -R-G-D-, and other biologically active molecules, may be deposited onto the scaffold. In addition, scaffolds may be fabricated using the techniques of the invention. For example, a tubular implant for use in nerve regeneration may be patterned to create a surface texture which would promote the elongation of axons and the myelination of nervous tissues. These textured surfaces may additionally be coated with extracellular matrix materials and other biological molecules which promote cell growth, adhesion, migration, or elongation. Scaffolds may also be produced for use in tissue engineering of blood vessels. The interior and exterior surfaces of these scaffolds may be patterned to promote the development of epithelial and endothelial cells. In addition, these implants may be patterned either additively or subtractively to promote the growth of smooth muscle tissue, a component of the arterial wall. Cylinders and other tubular shapes may also be produced to facilitate the regeneration of connective tissues such as tendon and ligament. For example, in many injuries where a section of the tendon or ligament is crushed, a healing model is proposed in which the undamaged portions of the tissue are fed into opposite ends of a tube which promotes growth of the tissue across the gap between the two ends. This cylinder is preferably biodegradable and may include agents which promote the migration growth and synthetic activity of connective tissue cells such as tenocytes. Substrates can also be fabricated as cylinders which both include the biological agents and are textured to facilitate the migration of cells and the formation of healthy tissue.

The techniques of the invention may also be used to print biodegradable or biocompatible coatings on long term prostheses such as pacemakers and hip implants. These coatings may be designed to promote cell or tissue adhesion or to discourage a biological process such as clotting. The invention may also be used to provide mechanical texture to such implants to facilitate their retention in the body. Patterning and contact printing techniques may also be used in the fabrication in such materials. For example, they may be used to fabricate electrodes for pacemakers that have a larger effective surface area than current electrodes.

The invention also has potential applications in applied physics, for example, in the production of diffraction gratings in optical fibers. Optical fibers are formed from a core of a first material that is surrounded by a cladding of a second material having a lower index of refraction. The mechanical integrity of the fiber is protected by forming a jacket, preferably polymeric, about the surface of the cladding. In some optical fibers, the core material experiences a change in refractive index upon exposure to light at a specific wavelength and a threshold intensity. By forming a pattern of an opaque material about the surface of an optical fiber, the refractive index of the core material of the fiber can be patterned by exposing the patterned fiber to light as described above. Indeed, it is not necessary that the material patterned on the fiber be completely opaque. It only needs to modify the intensity, wavelength, or phase of the radiation to prevent modification of the refractive index of the shielded material or enable differential modification of the refractive index of the masked and unmasked portions. The surface of the fiber may be patterned according to any of the techniques described above. For example, the entire surface may be metallized and a resist placed on the surface to enable removal of the unpatterned metal coating, leaving the resist-coated metal behind to prevent transmission of light into the fiber. Alternatively, the pattern may be placed on the surface through electroless plating. In another embodiment, the stamping surface of a transparent stamp may be patterned with an opaque material. The stamp can be used as a mask through which a fiber-optic cable disposed in the lumen can be irradiated.

Exemplary materials that may be used to produce patterned optical fibers include those which exhibit a change in refractive index upon exposure to radiation, especially at UV or visible wavelengths, including glass, germanium oxide glass, silica doped with germanium, europium or cerium, x-ray treated glass, lithium and strontium barium niobates, barium titanate, polycrystalline materials, photopolymers, and Kerr-effect materials. While lasers provide a convenient source of patterning radiation, any source of radiation may be used so long as it can induce the desired change in refractive index and is compatible with the pattern on the optical fiber. Frequency doubled or recently developed blue lasers can also be used to practice the invention (Nakamura, et al., *Appl. Phys. Lett.*, 70: 868, 1997). Additional information on applications and exemplary materials for patterned fibers can be found in U.S. Pat. No. 5,951,881, the contents of which are incorporated herein by reference.

The techniques of the invention may also be used to create microcoils for electrical applications. A glass tube or rod may be stamped with a metallic coating such as silver and then electroplated to build up a thick coil, preferably 1 micrometer thick. In an alternative embodiment, the coil may be formed via fluidic patterning of the metallic precursor followed by electrochemical deposition of the microcoil material using the fluidic patterning techniques of the invention. If the stamped metallic coating is not adherent, a primer coat such as titanium may be provided or the metal may be deposited using electroless techniques. Alternatively, the entire tube may be coated with a metal using conventional techniques such as evaporation. This coating may then be selectively etched and electroplated using the techniques of the invention. Multiple coils may be provided by patterning the interior and exterior of a tube or by combining tubes of various diameters concentrically.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method of patterning a surface, comprising:
   providing a stamp having a lumen with a portal;
   passing at least a portion of a substrate into the lumen via the portal; and
   modulating the dimensions of the stamp by reducing a cross sectional dimension of the lumen to place an interior stamping surface of the lumen in contact with an exterior surface of the substrate and thereby producing a pattern on the exterior surface of the substrate.

2. The method of claim 1, further comprising modulating the dimensions of the stamp before the step of passing at least a portion of a substrate into the lumen.

3. The method of claim 1, further comprising, after the step of modulating the dimensions of the stamp to place the stamping surface in contact with the substrate, modulating the dimensions of the stamp to facilitate removal of the stamping surface from the substrate.

4. The method of claim 1, wherein the step of modulating the dimensions comprises a member of the group consisting of applying a mechanical stress, applying an electrical stimulus, removing a mechanical stress, removing an electrical stimulus, creating a partial vacuum, venting a vacuum, applying a magnetic field, removing a magnetic field, and any combination of the above.

5. The method of claim 4, wherein the mechanical stress comprises a positive hoop stress, a negative hoop stress, or a hydrostatic stress.

6. The method of claim 1, wherein the entirety of the stamp is modulated at the same time.

7. The method of claim 1, wherein at least one of the stamping surface and a surface of the substrate exhibits convexity in at least one dimension, and said convexity does not result from a surface texture or pattern.

8. The method of claim 1, further comprising exposing the substrate to electromagnetic radiation by transmitting said radiation through the stamp, wherein a portion of the stamp is opaque to said radiation.

9. The method of claim 1, further comprising disposing a transferable material on the stamping surface, wherein, when the stamp is in contact with the substrate, the transferable material is transferred to the substrate in a pattern corresponding to the pattern on the stamping surface.

10. The method of claim 9, wherein the transferable material comprises a member of the group consisting of a self-assembled monolayer forming molecule, a protein, an amino acid sequence, a synthetic peptide, a simple carbohydrate, a nucleic acid sequence, a lipid, a complex carbohydrate, an organic molecule, a polymer precursor, an inorganic molecule, an organometallic complex, a metal, a metallic species in a solvent, a metal colloid in a solvent, biological particles suspended in a carrier, and non-biological particles suspended in a carrier, an electroless plating precursor, and any combination of the above.

11. The method of claim 1, wherein the stamping surface comprises a pattern comprising at least one channel defined by raised portions on the surface of the stamp.

12. The method of claim 11, wherein a cross section of the stamp includes two raised portions, and wherein an angular distance between the two raised portions is between 0° and 180°.

13. The method of claim 11, wherein a lateral dimension of a channel or a raised portion is 100 nm or greater.

14. The method of claim 11, further comprising:
placing the channel in fluidic communication with a fluid source; and
causing a fluid to flow from the fluid source through a path bounded by the raised portions and the substrate.

15. The method of claim 14, wherein the fluid comprises a member of the group consisting of an etchant, a polymer precursor, a sol-gel fluid, a metal colloid in a solvent, cells suspended in a medium, a metallic species in a solvent, a metal, an electroplating solution, an electroless plating solution, a reactive gas, and any combination of the above.

16. The method of claim 14, wherein the fluid comprises a solution comprising a member of the group consisting of a self-assembled monolayer forming molecule, a protein, an amino acid sequence, a synthetic peptide, a simple carbohydrate, a nucleic acid sequence, a lipid, a complex carbohydrate, an organic molecule, a polymer precursor, an inorganic molecule, an electroless plating precursor, an organometallic complex, a metallic species, cells in a medium, and any combination of the above.

17. The method of claim 14, further comprising adjusting the temperature of the fluid while it is in the channel.

18. The method of claim 14, further comprising exposing the fluid in the channel to an electric current, a magnetic field, or electromagnetic radiation.

19. The method of claim 14, further comprising exposing the fluid to ultraviolet light.

20. The method of claim 14, further comprising adjusting the temperature of the substrate while the fluid is in the channel.

21. The method of claim 14, wherein a lateral dimension of a channel or raised portion is 200 nm or greater.

22. The method of claim 14, further comprising disposing a material on the substrate before the step of causing, wherein a component of the fluid interacts with the material when it is disposed in the channel.

23. The method of claim 14, wherein the fluid comprises a carrier and a material dissolved or suspended in the carrier, wherein the method further comprises allowing the carrier to dissipate and the material to harden.

24. The method of claim 11, further comprising wetting the stamping surface with a fluid, wherein, when the stamping surface is in contact with the surface of the substrate, an interaction of the substrate with the fluid causes the substrate to develop a surface texture in a pattern conforming to the stamping surface of the stamp.

25. The method of claim 24, wherein the fluid dissolves or swells the substrate.

26. The method of claim 24, wherein the substrate comprises a polymer.

27. The method of claim 1, wherein the substrate comprises a metallic material, a semiconductor material, a ceramic, or a polymer.

28. The method of claim 27, wherein the substrate comprises a coating comprising a metallic material, a semiconductor material, a ceramic, a glass, or a polymer.

29. The method of claim 1, further comprising disposing a material on the substrate before the step of passing.

30. The method of claim 1, wherein the stamp has a diameter of at least 100 micrometers.

31. The method of claim 1, wherein the stamp and the substrate have the same or different shapes.

32. The method of claim 1, wherein walls defining the lumen are characterized by flat, curved, or a combination of both.

33. The method of claim 1, wherein the stamp is tubular.

34. The method of claim 1, further comprising increasing a cross sectional dimension of the lumen before the step of passing the at least a portion of the substrate into the lumen.

35. The method of claim 1, wherein the stamp is cylindrical.

36. The method of claim 1, wherein the stamp is spherical.

37. The method of claim 1, wherein the stamp is elliptical.

38. The method of claim 1, wherein the stamp is polygonal.

39. The method of claim 1, wherein the stamp takes the shape of a spheroid having a variety of diameter lengths.

40. The method of claim 1, wherein the lumen has only one portal.

41. A method of patterning a surface, comprising:
providing a stamp having a lumen with a first portal;
providing a substrate having a lumen with a second portal;
passing at least a portion of the stamp into the lumen of the substrate via the second portal; and modulating the dimensions of the stamp by increasing a cross sectional dimension of the lumen of the stamp to place an exterior stamping surface of the stamp in contact with an interior surface within the lumen of the substrate and thereby producing a pattern on the interior surface within the lumen of the substrate.

42. The method of claim 41, further comprising reducing a cross sectional dimension of the lumen of the stamp before the step of passing the at least a portion of the stamp into the lumen of the substrate.

* * * * *